United States Patent [19]

Richter et al.

[11] 4,162,919

[45] Jul. 31, 1979

[54] LAMINATES FOR THE MANUFACTURE OF FLEXOGRAPHIC PRINTING PLATES USING BLOCK COPOLYMERS

[75] Inventors: Peter Richter, Ludwigshafen; August Wigger, Waldsee; Gerhard Fahrbach, Plankstadt; Erhard Seiler, Ludwigshafen; Helmut Barzynski, Bad Duerkheim, all of Fed. Rep. of Germany

[73] Assignee: BASF Aktiengesellschaft, Ludwigshafen, Fed. Rep. of Germany

[21] Appl. No.: 851,824

[22] Filed: Nov. 16, 1977

Related U.S. Application Data

[63] Continuation of Ser. No. 635,629, Nov. 26, 1975, abandoned.

[30] Foreign Application Priority Data

Nov. 29, 1974 [DE] Fed. Rep. of Germany ....... 2456439

[51] Int. Cl.$^2$ .................... G03C 1/78; G03C 1/68; G03C 1/76; G03C 5/00
[52] U.S. Cl. .................... 96/87 R; 96/35.1; 96/67; 96/86 P; 96/115 R

[58] Field of Search .............. 96/35.1, 36.3, 67, 86 P, 96/115 R, 115 P, 33, 87 R

[56] References Cited

U.S. PATENT DOCUMENTS

| | | | |
|---|---|---|---|
| 3,024,180 | 3/1962 | McGraw | 96/115 P |
| 3,186,844 | 6/1965 | Alles et al. | 96/35.1 |
| 3,467,523 | 9/1969 | Seidel et al. | 96/115 |
| 3,508,492 | 4/1970 | Seibert | 96/36.3 |
| 3,677,920 | 7/1972 | Kai et al. | 96/36.3 |
| 3,764,324 | 10/1973 | Reyes | 96/36.3 |
| 3,796,578 | 3/1974 | Hosoi et al. | 96/35.1 |
| 3,861,921 | 1/1975 | Hoffmann et al. | 96/35.1 |

*Primary Examiner*—Edward C. Kimlin
*Attorney, Agent, or Firm*—Keil & Witherspoon

[57] ABSTRACT

Laminates for the manufacture of flexographic printing plates and containing (a) a layer consisting essentially of a photocrosslinkable mixture of a two-block copolymer of from 30 to 95% w/w of a diene hydrocarbon and from 5 to 70% w/w of a styrene monomer or a partially hydrogenated product thereof with a compatible monomer having at least one C—C double bond, said mixture containing a photo-initiator, (b) a non-photocrosslinkable elastomeric underlayer having a Shore A hardness of from 15 to 70 and (c) a non-photocrosslinkable stablizing layer preferably between layers (a) and (b).

8 Claims, No Drawings

LAMINATES FOR THE MANUFACTURE OF FLEXOGRAPHIC PRINTING PLATES USING BLOCK COPOLYMERS

This is a continuation, of application Ser. No. 635,629, filed Nov. 26, 1975, now abandoned.

This invention relates to novel advantageous laminates for the manufacture of flexographic printing plates and containing a photocrosslinkable layer based on a polymer-monomer mixture, an elastomeric underlayer and a stabilizing layer. The invention also relates to the manufacture of flexographic printing plates by imagewise exposure of the photocrosslinkable layer of said laminates followed by removal or washout of the unexposed and non-crosslinked portions of said layer.

Photopolymerizable laminates for the manufacture of relief printing plates for flexographic printing are known per se and are described, for example, in German Published Applications Nos. 2,062,563; 2,138,582; 2,215,090; and 2,223,808, and in U.S. Pat. Nos. 2,948,611; 3,024,180; 3,658,531; and 3,674,486. However, the prior art materials are not satisfactory in practice in some respects. For example, some of the prior art relief printing plates exhibit insufficient flexibility and elasticity, whilst others tend to undergo plastic deformation when subjected to high shear stresses and elevated printing pressures and are thus inferior to vulcanized rubber used in conventional rubber plates. Poor resistance to solvents contained in printing inks often leads to premature destruction of the printing relief layer. A high degree of swelling of the printing plate during washout necessitates undesirably long drying times before use. British Pat. No. 1,366,769 discloses the use of block copolymers of the type A-B-A as polymers for the relief layer based on a photocrosslinkable mixture of polymers and monomers, which block copolymers consist of an elastomeric polymer block between two thermoplastic non-elastomeric polymer blocks, examples of such systems being styrene-isoprene-styrene and styrene-butadiene-styrene three-block copolymers. These block copolymers have the disadvantage that they are difficult to manufacture with exactly reproducible properties and that their highly concentrated solutions are difficult to process, for example, in the production of uniform photopolymerizable layers. Furthermore, they often cause haze in the photopolymerizable layer.

It is an object of the present invention to provide laminates for the manufacture of flexographic printing plates which are simple and economical to manufacture with readily reproducible properties and in which the photopolymerizable layer may be produced by a conventional casting method using highly concentrated solutions and is readily soluble, in the uncrosslinked state, in conventional developer solutions, the relief printing plates made therefrom by exposure and development being highly suitable for printing and showing good resistance to conventional ink diluents.

We have found that the above object can be substantially achieved with laminates for the manufacture of flexographic printing plates and consisting of (a) a layer RS consisting essentially of a photocrosslinkable mixture of at least one soluble polymer P with at least one monomer M which is compatible with said polymer P and contains at least one photocrosslinkable C—C double bond, which mixture contains a photoinitiator and, if desired, conventional additives and is soluble in developer solutions used to form the relief in the imagewise-exposed layer RS, (b) a non-photocrosslinkable elastomeric underlayer U which is not soluble in said developer solutions and which has a Shore A hardness of from 15 to 70, (c) a non-photocrosslinkable stabilizing layer ST which is not soluble in said developer solutions, which laminates are characterized in that the photocrosslinkable layer RS contains, as polymer P, a soluble two-block copolymer of from 30 to 95% w/w of a diene hydrocarbon having 4 or 5 carbon atoms and from 5 to 70% w/w of a monomer of the formula

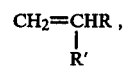

where R denotes hydrogen or $CH_3$ and R' denotes phenyl or $C_{1-4}$ alkyl-substituted phenyl, which has a viscosity number (measured on a 0.5% w/w solution in toluene at 25° C.) of from 60 to 350 ml/g, or a partially hydrogenated product thereof.

The two-block copolymer of the above kind may be one having either a sudden or a gradual transition between the two block segments of the copolymer formed only of diene hydrocarbon and styrene-type monomer. Suitable diene hydrocarbons having 4 or 5 carbon atoms are, in particular, butadiene and isoprene and suitable comonomers of the formula

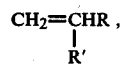

in which R is hydrogen or $CH_3$ and R' is a $C_{1-4}$ alkyl-substituted or non-substituted phenyl radical, are styrene, α-methyl styrene, vinyl toluene, t-butyl styrene; of these, styrene is preferred. The content of units of the last-named styrene-type monomers in the two-block copolymer is from 5 to 70% and preferably from 10 to 40%, by weight, and that of the polymerized units of the diene hydrocarbon is thus from 30 to 95% and preferably from 60 to 90%, by weight. Manufacture of the two-block copolymers of the above kind is known and may be effected, in particular, in the manner described in U.S. Pat. No. 3,149,182. Reference is also made to I. Kuntz, J. Polymer Sci. 54 (1961), pages 569 to 586, and to Y. U. Spirin et al, J. Polymer Sci. 58 (1962), pages 1181 to 1189. The copolymers may be manufactured by a batch or continuous process. When producing copolymers having sudden transitions between the block segments by step-wise copolymerization it is convenient to begin with the polymerization of that monomer which is to be present in the largest amount. It is advantageous to carry out the preparation of the two-block copolymers by solution polymerization, particularly suitable solvents being hydrocarbons or mixtures thereof and polar solvents such as tetrahydrofuran. The type of solvent used has an influence on the microstructure of the two-block copolymer and on the configuration of the diene polymer segments. We prefer to use hydrocarbons as solvent. It is particularly advantageous to use the solutions of the block copolymers prepared by solution polymerization either directly or in a more concentrated form, after the addition of the other layer components, for preparing the photocrosslinkable layer RS by casting. Also suitable are partial hydrogenation products of said two-block copolymers, by which we mean those in which the diene segments of the copolymer are entirely or, preferably, partially hydrogenated. Highly suitable are hydrogenation products such as are prepared by the process described in German Published Application No. 2,013,263.

Suitable two-block copolymers of the above kind have a viscosity number (measured on a 0.5% w/w solution in toluene) of from about 60 to 350 ml/g and in particular from 90 to 250 ml/g, these values corresponding to a range of molecular weights $\overline{M}_v$ of from about 75,000 to 200,000. It is of course also possible to use mixtures of two-block copolymers of the above kind or, for special applications, to mix two-block copolymers with minor quantities of other compatible polymers and, in particular, elastomers.

Highly suitable mixtures of polymers P with monomers M for the photocrosslinkable layer RS contain from 60 to 95% and in particular from 70 to 95%, by weight, of polymers P and from 5 to 40% and in particular from 5 to 30%, by weight, of monomers M. Particularly suitable examples of monomers M having at least one photocrosslinkable, i.e., photopolymerizable, C—C double bond which are substantially compatible with the polymer P are the esters of acrylic and/or methacrylic acids with monohydric or polyhydric alcohols, for example n-butyl acrylate, n-butyl methacrylate, 2-ethylhexyl acrylate, lauryl acrylate, 2-hydroxypropyl acrylate, hexanediol-1,6-dimethacrylate, hexanediol-1,6-diacrylate, 1,1,1-trimethylolpropane triacrylate, pentaerythritol tetraacrylate and diethylene glycol dimethacrylate. Also suitable, in small amounts, are amides of methacrylic or acrylic acid, for example N-methylol-methacrylamide butyl ether. Also suitable are N-vinyl compounds such as N-vinylpyrrolidone, vinyl esters of aliphatic monocarboxylic acids such as vinyl oleate, vinyl ethers of diols such as butanediol-1,4-divinyl ether, and allyl ethers and allyl esters. Monomers which have also been found to be particularly suitable are isocyanate-free reaction products of organic polyisocyanates such as hexamethylene diisocyanate, isophorone diisocyanate and toluylene diisocyanate and hydroxyl-containing acrylates or methacrylates such as ethylene glycol monoacrylate, hydroxypropyl methacrylate and 1,4-butanediol monoacrylate, provided they are sufficiently compatible with the polymer P. The same applies to the reaction products of diepoxides or polyepoxides, for example butanediol-1,4-diglycidyl ether and bisphenol A diglycidyl ether with methacrylic or acrylic acid. The properties of the photopolymerizable layers RS can be modified for special purposes by appropriate choice of the monomers or mixtures thereof. The layer RS also contains, as usual, a photoinitiator, generally in an amount of from 0.01 to 10% and in particular from 0.01 to 5%, by weight, examples being benzoin or benzoin derivatives such as benzoin methyl ether and benzoin isopropyl ether. The layer RS may also contain other conventional additives such as thermal polymerization inhibitors, e.g., p-methoxyphenol, hydroquinone or salts of N-nitrosocyclohexylhydroxylamine, dyes, photochromic substances, antioxidants and plasticizers (to improve the processability when mixing the layer).

The thickness of the layer RS is advantageously from 200 to 3000 μm and in particular from 300 to 2000 μm. Preferred layers RS have, after photocrosslinking by overall exposure to actinic light, a Shore A hardness (measured according to DIN 53,505) of from 30 to 90 and in particular from 40 to 70 and are as hard or harder, in their photocrosslinked state, than the underlayer U used therewith.

The photocrosslinkable layers RS are particularly advantageously prepared from solutions thereof in suitable solvents such as cyclohexane, toluene, xylene and tetrahydrofuran, by casting, which is easy to carry out due to the fact that the two-block copolymers used in the present invention are distinguished by low solution viscosities and enable a homogeneous solution of the layer components to be produced. The use of elevated temperatures is thus unnecessary. The base for layer RS may be the stabilizing layer ST or the underlayer U or a protective sheet provided with a coating S as described below. If necessary, a permanent bond between the layers may be achieved by the use of suitable adhesives or adhesive interlayers.

It is often advantageous to apply a thin, firmly adhering, non-tacky coating S to the photocrosslinkable layer RS of the laminates, which coating S preferably consists of a polymer capable of forming hard, non-tacky, transparent and tear-resistant films, for example a polyamide or copolyamide which is soluble in the developer or a mixture of such a polymer with a small amount (10% by weight or less) of a photopolymerizable monomer, a photoinitiator and, if necessary, an inhibitor. The thickness of this coating S is advantageously from about 0.5 to 20 μm.

This coating S makes it possible to apply a negative to the laminate for the preparation of relief printing plates without the negative sticking to the laminate or bubbles forming, as would in some cases occur if the coating S were omitted on account of the surface tack of the layer RS. During development of the exposed areas of the layer RS to form the relief layer, the coating S is generally washed away together with the non-crosslinked areas.

It is also often advantageous to provide the coating S with a strippable protective sheet such as a polyester sheet, which sheet may, if desired, be applied to the layer RS at the same time as the coating S. In general, the protective sheet is removed from the layer RS before exposure, whilst the coating S generally remains on said layer RS during exposure.

The elastomeric underlayer U has a Shore A hardness of from 15 to 70 and preferably from 25 to 60 and its thickness is generally from 0.5 to 6 mm and in particular from about 1 to 4 mm. The hardness of the underlayer U is, in the preferred embodiment of the laminates, equal to or less than the hardness of the layer RS in the photocrosslinked state.

Suitable elastomeric materials for the underlayer U are for example natural rubber, polybutadiene, butadiene-acrylonitrile copolymers, butadiene-styrene copolymers, silicone rubber, polysulfide rubber, vinylidene chloride-hexafluoropropylene copolymers, isoprene-styrene and butadiene-styrene block copolymers and, in particular, polyurethane elastomers which may be prepared in known manner from relatively high molecular weight polyhydroxyl compounds such as polyesters or polyethers, and optionally low molecular weight polyols and polyisocyanates, in particular diisocyanates. Reference is made in this connection, for example, to Saunders-Frisch, "Polyurethanes," Part II, Chapter IX, Interscience Publishers Inc., New York, 1964. The materials used in layer U should conveniently be such as can be processed into layers having a low tolerance on thickness, for example by casting and hardening in molds or heatable centrifuges or, in the case of thermoplastic materials, for example by calandering. The base may, if desired, be of the same material as the layer RS if this is processed to the required dry layer thickness and then photocrosslinked by overall exposure. Alternatively, the layer U may be prepared from foam-like materials or foams themselves may be used, provided they exhibit a suitable degree of elasticity and do not absorb the printing inks or developer solutions. Preferably, the materials used in layer U are not soluble or only sparingly soluble in the solvents used for developing layer P.

The stabilizing layer ST is intended to impart absolute dimensional stability to the laminate and to prevent deformation of the printing plate when it is fitted to the cylinder of the printing press so as to enable a high degree of register to be achieved for multicolor printing. The layer ST may be located below the elastomeric underlayer U in the order RS-U-ST, but in the preferred embodiment of the laminates of the invention, the stabilizing layer ST is firmly bonded between the photopolymerizable layer RS and the elastomeric underlayer U. This embodiment has the added advantage that the underlayer U is not affected by the solvent liquid during development of the relief, thus avoiding swelling of the layer U and the need for increased subsequent drying. In the preferred position of layer ST, it generally has a thickness of from about 5 to 500 $\mu$m and in particular from 10 to 200 $\mu$m. The hardness of the stabilizing layer ST should be distinctly higher than that of the other layers. Advantageously, it has a modulus of elasticity (measured according to DIN 53,457) of from $1 \times 10^3$ to $2.1 \times 10^6$ and preferably from $5 \times 10^3$ to $2.1 \times 10^6$ kg/cm$^2$. Suitable materials for the stabilizing layer ST are for example plastics sheeting, metal layers or layers of crosslinked surface coating materials which may, if desired, be reinforced by fabrics such as glass fiber or textile fabrics. We prefer to use plastics sheeting such as polyester sheeting. The layers U, ST and RS, i.e., the relief layer, are firmly bonded together. Where suitable polymer materials having an appropriate chemical structure are used, such a bond may be readily achieved by, say, calandering under the action of suitable organic solvents for softening the surfaces of the layers. However, it is often necessary to provide a firm bond between the layers by applying to one or both sides thereof thin layers of adhesion promoters or adhesives followed by bonding of the layers, in which case thin layers of adhesive are formed between the layers, these having a thickness, however, of less than 100 $\mu$m and preferably less than 30 $\mu$m. Such adhesive layers may be prepared using conventional single component and two-component adhesives, the type used depending on the types of materials and polymers used in the layers U, ST and RS. Frequently used, suitable adhesives are, for example, the conventional two-component adhesives based on polyurethane and on polychloroprene, which may be applied to the layers to be bonded, for example, by casting in a suitable thickness. In some cases, where the layer ST is between the layers RS and U, it has proved advantageous to provide the elastomeric underlayer U, on the side remote from the layer ST, with an overlayer S' based on a non-tacky polymer and having a thickness of from 0.1 to 20 $\mu$m and particularly from 0.2 to 10 $\mu$m. Suitable polymers for this layer are often the same as those used in the preparation of the coating S. Again, the coating S' should preferably transmit actinic light.

The laminates of the invention may be used for the preparation of relief printing plates, particularly flexographic printing plates, in known manner by imagewise exposure of the layer RS and then removing the unexposed, i.e., non-crosslinked, areas of said layer RS, particularly by a washout process. Exposure, which may be effected in flat-plate exposure equipment or a rotary exposure unit, is suitably carried out using conventional light sources emitting actinic light, for example conventional ultraviolet fluorescent tubes or high-pressure mercury lamps. The emitted wavelength should preferably be from 300 to 400 m$\mu$ and should be correlated to the absorption characteristics of the photoinitiator contained in the layer RS. Examples of suitable developer solutions for washing out the non-crosslinked areas of layer RS to effect relief development are chlorinated hydrocarbons such as trichloroethane, symmetrical tetrachloroethane, tetrachloroethylene, hydrocarbons such as hexane, toluene and other organic solvents such as N-methylpyrrolidone or mixtures thereof with lower alcohols for controlling the washout process.

The laminates of the invention and the relief printing plates made therefrom have a number of advantages. The use of the two-block copolymer in the layer RS is superior to the use of three-block copolymers A-B-A as proposed in British Pat. No. 1,366,769, in that it is simpler and more economical to manufacture. Furthermore, three-block copolymers are much more difficult to produce with uniform, reproducible characteristics. Another advantage of the use of two-block copolymers is their much lower viscosity even at high concentrations, which means that even solutions with a high solids content show good pourability and thus make preparation of the layers more economical. The good solubility is also advantageous for development of the relief printing plates. Another advantage of the layers RS of the invention over those of British Pat. No. 1,366,769 is that they exhibit no haze even when stored for relatively long periods in the unexposed state but remain glass clear and are therefore capable of giving distinct demarcations between exposed and unexposed segments of the layer, which is not the case with cloudy layers. The two-block copolymers in admixture with the monomers show, after exposure, a surprisingly big improvement in their elastic properties, their flow resistance and their swelling resistance when contacted by the printing ink solvents most commonly used in flexographic printing. Layers RS containing partially hydrogenated two-block copolymers exhibit a particularly low tendency to oxidation. The laminates of the invention are distinguished not only by their simplicity of manufacture but also by the rapidity and ease with which they can be converted into relief printing plates and also by the good printing properties of the latter. The printing layer, when in use, readily conforms to irregularities in the surface of the material to be printed. Moreover, the relief image is not stretched when the plate is mounted on cylinders of different diameter, this being particularly important in multicolor printing.

In the following Examples the parts and percentages are by weight unless otherwise stated. Parts by volume bear the same relation to parts by weight as the liter to the kilogram.

EXAMPLE 1 a. A solution of 167.5 parts of a gradual-transition polystyrene-polybutadiene two-block copolymer having a content of 20% of polymerized units of styrene and a viscosity number of 142.4 ml/g and 0.2 part of 2,6-di-t-butyl-4-methylphenol in 220 parts by volume of tetrahydrofuran is prepared with stirring at 65° C. Following homogenization, 10 parts of hexanediol-1,6-diacrylate and 20 parts of lauryl acrylate are added. 2 parts of α-methylol benzoin methyl ether, 0.2 part of hydroquinone monomethyl ether and 0.06 part of a commercially available black dye are dissolved in some tetrahydrofuran with a little methanol, and the resulting solution is mixed into the polymer solution. A 125 μm thick polyethylene terephthalate sheet (protective sheet) provided with an approximately 1 μm thick layer S of a soluble copolyamide is knife-coated with the resulting solution such that, after drying, a 670 μm thick layer RS is produced.

After exposure in a flat-plate exposure unit provided with 60 watt ultraviolet fluorescent lamps, a photocrosslinked sample of the layer RS has a Shore A hardness of 60 and a resilience, as measured by DIN 53,512, of 55%.

b. An unexposed specimen as prepared under 1a above is bonded to a transparent polyethylene terephthalate sheet having a thickness of 75 μm by means of a commercial two-component polyurethane adhesive applied in a thickness of 20 μm, the bond being between the said polyethylene terephthalate sheet and the side of said specimem remote from the protective layer. The other side of said polyethylene terephthalate sheet is bonded, using the same adhesive, to a 2 mm thick elastomeric underlayer U prepared from a polyester glycol, toluylene diisocyanate and an activator and cured at 130° C. The underlayer U has a Shore A hardness of 37 and a resilience of 45%.

c. When the 125 μm thick polyester protective sheet originally serving as base for the application of the relief layer RS is stripped off, the polyamide film remains on the unexposed relief layer RS due to better adhesion and thus makes it possible to place a negative in contact therewith without it sticking thereto or bubbles being formed, for the purpose of exposure through a photographic negative. Following preliminary exposure from the rear side of the laminate for 30 seconds over the entire area of the relief layer RS through the underlayer U (underlayer U facing the light source), the relief layer RS is exposed through a combined line/halftone negative for about 15 minutes. The relief is then developed for 4 minutes in a spray washer using a mixture of trichloroethylene and isopropanol (ratio by volume 70:30). Following brief drying and post-exposure of the entire plate for 10 minutes, a relief printing plate is obtained which is distinguished by very good reproduction of all details contained in the negative and which shows excellent printing properties.

EXAMPLE 2

As described in Example 1, a solution of 35 parts of a polyisoprene-polystyrene two-block copolymer showing a sharp transition between the blocks and having a viscosity number of 158 and a content of 25% of polymerized units of styrene in 65 parts of toluene is prepared, to which solution 7 parts of butanediol-1,4-dimethacrylate, 0.03 part of toluhydroquinone, 0.4 part of α-methylol benzoin methyl ether and 0.05 part of di-2,6-t-butyl-4-methylphenol are added. As in Example 1, a layer RS is made from the resulting solution and this is then used to prepare a laminate in the manner described above. The photocrosslinked relief layer RS has a Shore A hardness of 58 and a resilience of 55%. Relief printing plates made from the laminate in the manner described above showed very good printing properties.

EXAMPLE 3

Example 2 is repeated except that 40 parts of a sharp-transition polyisoprene-polystyrene two-block copolymer having a viscosity number of 82 and a content of 20% of polymerized units of styrene are used for the preparation of the solution for the formation of layer RS. The Shore A hardness of the relief layer RS, in the photocrosslinked state, of the resulting laminate is 48.

EXAMPLE 4

Example 2 is repeated except that 12 parts of hexanediol-1,6-dimethacrylate are used in place of 7 parts of butanediol-1,4-dimethacrylate. The photocrosslinked relief layer has a Shore A hardness of 44 and a resilience of 53%.

EXAMPLE 5

The material used in Example 1a for the layer RS is poured onto a 50 μm thick polyethylene terephthalate sheet acting as layer ST so as to form a layer thereon having a thickness of 1.5 mm when dry. The layer is then exposed over its entire surface for 30 minutes under a bank of 60 watt ultraviolet fluorescent tubes, i.e., it is completely photocrosslinked to form an underlayer U. The other, free side of the polyester sheet (layer ST) is then bonded, by means of a commercial chloroprene adhesive, to the unexposed layer RS prepared as in Example 1a, the bond being between said free side of the polyester sheet and the free side of the layer RS. There is obtained a laminate in which, after exposure and photocrosslinking of the relief layer RS, the layer RS (photocrosslinked) and the underlayer U have the same mechanical properties.

We claim:

1. Laminates for the production of relief printing plates and comprising
(a) a layer RS consisting essentially of a photocrosslinkable mixture of at least one soluble polymer P and at least one monomer M which is compatible with polymer P and has at least one photocrosslinkable C—C double bond, which mixture contains a photoinitiator and, optionally, conventional additives and is soluble in developer solutions used to form the relief in the imagewise-exposed layer RS,
(b) a non-photocrosslinkable elastomeric underlayer U which has a Shore A hardness of from 15 to 70 and is insoluble in said developer solutions,
(c) a non-photocrosslinkable stabilizing layer ST which is insoluble in said developer solutions,
wherein the photocrosslinkable layer RS contains, as polymer P, a soluble two-block copolymer consisting essentially of from 30 to 95% by weight of a diene hydrocarbon having 4 to 5 carbon atoms and from 5 to 70% by weight of a monomer of the formula

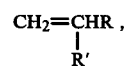

where R is hydrogen or CH$_3$; R' is phenyl or C$_{1-4}$ alkyl substituted phenyl, which two-block copolymer has a viscosity number (measured on a 0.5% w/w solution in toluene at 25° C.) of 60 to 350 ml/g, or a partially hydrogenated product thereof and which has either a sudden or gradual transition between the diene hydrocarbon block and the

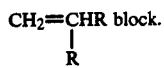

2. Laminates as claimed in claim 1, wherein the layer RS consists essentially of a mixture of from 60 to 95% by weight of the two-block copolymer P and from 5 to 40% by weight of a compatible monomer M having at least one photocrosslinkable C—C double bond, which mixture contains from 0.01 to 10% by weight of photoinitiator and, optionally, conventional additives, the precentages of P and M totalling 100.

3. Laminates as claimed in claim 1, wherein the two-block copolymers P are prepared by solution polymerization to have sudden or gradual transitions between the two-block segments of the copolymer.

4. Laminates as claimed in claim 1, wherein the photocrosslinkable layer RS has a thickness of from 200 to 3000 μm and the elastomeric underlayer U has a thickness of from 0.5 to 6 mm.

5. Laminates as claimed in claim 1, wherein the stabilizing layer ST has a thickness of from 5 to 500 μm and is firmly bonded between the photocrosslinkable layer RS and the elastomeric underlayer U.

6. Laminates as claimed in claim 1, wherein the Shore A hardness of the relief-forming layer RS following photocrosslinking by overall exposure to actinic light is from 30 to 90.

7. Laminates as claimed in claim 1, wherein the photocrosslinkable layer RS has a non-tacky coating S which transmits actinic light and which is optionally covered by a protective sheet.

8. Laminates as claimed in claim 1, wherein partial hydrogenation products of the two-block copolymer P are used in which the diene segments are partially or completely hydrogenated.

* * * * *